United States Patent
Freitas et al.

[11] Patent Number: 5,909,458
[45] Date of Patent: Jun. 1, 1999

[54] LOW-COST LASER DIODE ARRAY

[75] Inventors: Barry L. Freitas; Jay A. Skidmore, both of Livermore, Calif.

[73] Assignee: The Regents of the University of California, Oakland, Calif.

[21] Appl. No.: 08/753,657

[22] Filed: Nov. 27, 1996

[51] Int. Cl.$^6$ ..................................... H01S 3/043
[52] U.S. Cl. ............................................. 372/36
[58] Field of Search ................................. 372/36; 257/99

[56] References Cited

U.S. PATENT DOCUMENTS

| | | | |
|---|---|---|---|
| 5,040,187 | 8/1991 | Karpinski | 372/50 |
| 5,105,429 | 4/1992 | Mundinger et al. | 372/34 |
| 5,325,384 | 6/1994 | Herb et al. | 372/36 |
| 5,394,426 | 2/1995 | Joslin | 372/36 |
| 5,521,931 | 5/1996 | Biegelsen et al. | 372/36 |

Primary Examiner—James W. Davie
Attorney, Agent, or Firm—John P. Wooldridge

[57] ABSTRACT

A substrate is used to fabricate a low-cost laser diode array. A substrate is machined from an electrically insulative material that is thermally conductive, or two substrates can be bonded together in which the top substrate is electrically as well as thermally conductive. The substrate thickness is slightly longer than the cavity length, and the width of the groove is wide enough to contain a bar and spring (which secures the laser bar firmly along one face of the groove). The spring also provides electrical continuity from the backside of the bar to the adjacent metalization layer on the laser bar substrate. Arrays containing one or more bars can be formed by creating many grooves at various spacings. Along the groove, many bars can be adjoined at the edges to provide parallel electrical conduction. This architecture allows precise and predictable registration of an array of laser bars to a self-aligned microlens array at low cost.

15 Claims, 5 Drawing Sheets

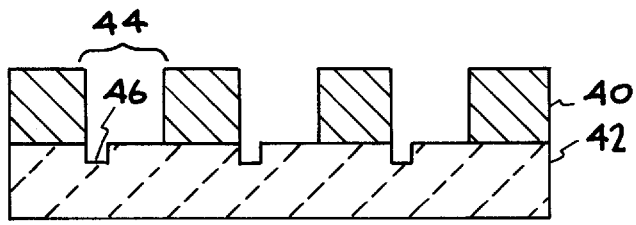
FIG. 4E
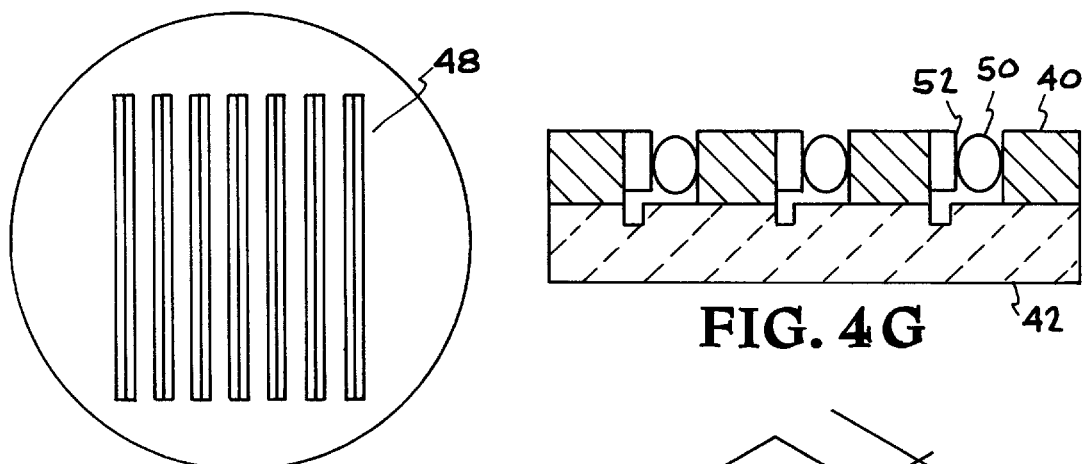
FIG. 4F
FIG. 4G
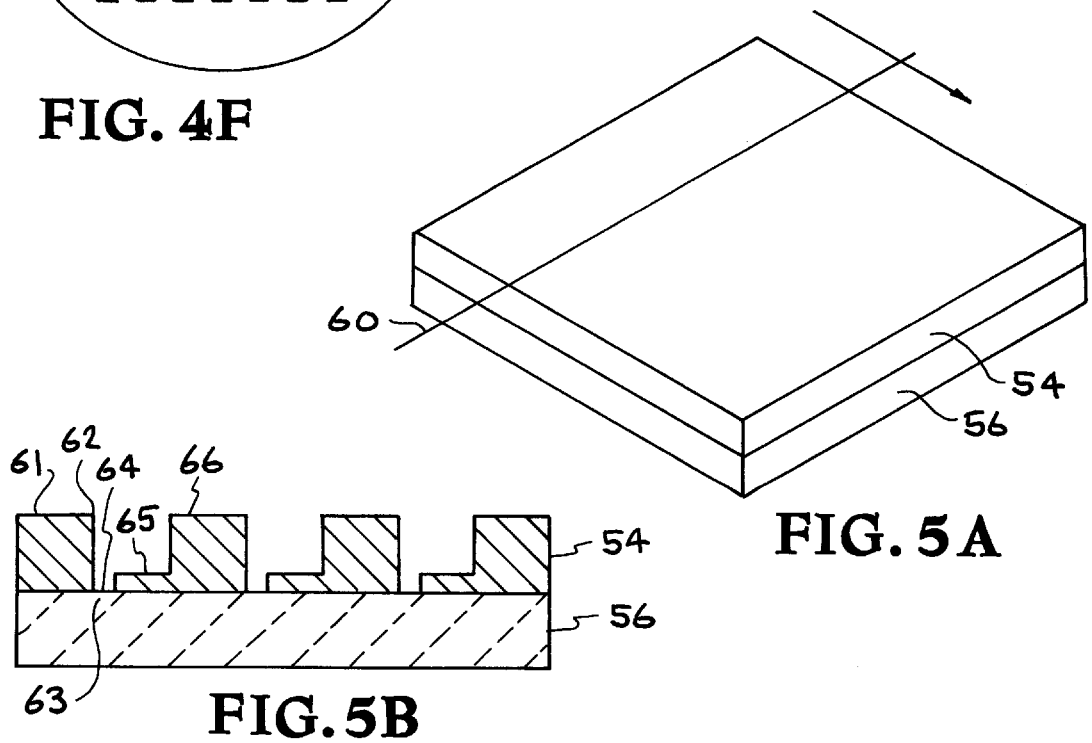
FIG. 5A
FIG. 5B

LOW-COST LASER DIODE ARRAY

The United States Government has rights in this invention pursuant to Contract No. W-7405-ENG48 between the United States Department of Energy and the University of California for the operation of Lawrence Livermore National Laboratory.

BACKGROUND OF THE INVENTION

1. Field of the Invention

The present invention relates to laser diodes and more specifically, it relates to a low cost laser diode array.

2. Description of Related Art

Laser diode arrays are used in a wide range of commercial, medical and military applications: materials processing (soldering, cutting, metal hardening), display technology/graphics, medical imaging (MRI) and surgical procedures (corneal shaping, tissue fusion, dermatology, photodynamic therapy), satellite communication, remote sensing, and laser isotope separation. In certain solid-state laser applications it is desirable to use laser diode arrays to optically excite, i.e., "pump," the crystal hosts. Diodes offer a narrow band of emission (reducing thermal lensing), compactness, high electrical efficiency and higher reliability as compared to flash lamps. Despite these numerous advantages, however, diode-pumped solid-state lasers (DSPSLs) have gained slow market acceptance due to the high cost associated with the laser diode array pumps. Significant diode array cost reductions would enable wide deployment of DPSSLs and new architectures to be realized that were previously cost prohibitive. In particular, low-cost diode arrays would bolster the inertial confinement fusion (ICF) and inertial fusion energy (IFE) programs that require low-repetition rate laser diode arrays in very high volumes.

Historically, much of the research and development in this area was devoted to solving diode material and fabrication issues in order to improve the yield and reliability of laser diodes. High quality InAlGaAs and InGaAsP laser diodes are now commercially available for pumping Nd:YAG at ~810 nm. As much as 100 W/cm of peak power is possible under pulsed operation, and over 10,000 hours of continuous operation (CW) in commercial systems has been demonstrated at reduced power levels (20–30 W CW). Although these types of performance improvements have led to cost reductions in the past, there has not been a complementary improvement in the packaging technology, which is now limiting further cost reductions from being achieved.

To date, most packaging/heatsink schemes use a "rack and stack" architecture. In this method, individual laser bars are fabricated into sub-assemblies, and the sub-assemblies are then bonded together to produce larger two-dimensional arrays. Labor intensive steps associated with handling individual components prevents the production of arrays in large volume and in high yield. To alleviate this problem, a "monolithic" fabrication approach known as "bars-in-grooves" was proposed. This process was comercialized by Laser Diode Array Inc. and it represents the only "monolithic" technology that is commercially available today. There are trade offs associated with using a monolithic technique (e.g. by LDA Inc.) and the salient issues are discussed below.

The grooves must be deliberately over-sized to facilitate mounting the bars (as well as to allow for a range of diode bar thicknesses). Accurate final placement of the laser bar is therefore difficult to achieve as solder is used to fill in the void left by the over-sized grooves. This prohibits accurate collimation (tensing) of the laser diodes which is desirable in "high-brightness" applications that are often used in "end-pumped" geometries. More importantly, flowing solder around the bars can damage, or short-out bars which lowers yield and represents a serious liability to packaging costs of a completed array. Either that, or the strict process controls and/or lower yield of "suitable" bars that is necessary poses a cost penalty with this soldering technique. The following invention improves upon the limitations of the former "bars-in-grooves" method, while still benefiting from being a monolithic or quasi-monolithic approach. The placement of the laser diodes is well defined, and the soldering process can be extremely well controlled, or not used at all, which ensures a high yield that is crucial for a low-cost high yield production of laser diode arrays. It is emphasized that in the description by Karpinski et al. (U.S. Pat. No. 5,040, 187), there is a method for flexing the substrate in order to facilitate loading laser bars. However, both the groove width and diode bar thickness would have to be controlled to such a high level of accuracy that this approach appears to be impractical. The present invention allows a practical implementation of a "solderless" contact because individual springs can accomodate any thickness variations of the individual components.

SUMMARY OF THE INVENTION

It is an object of the present invention to provide low cost laser diode arrays.

It is also an object of the present invention to provide a laser diode array that utilizes a metallic spring to provide electrical continuity to a laser diode bar in the laser diode array.

It is another object of the present invention to provide a spring to index a laser diode bar against one side-wall of a groove in a substrate of a laser diode array.

It is another object of the present invention to provide accurate, repeatable alignment of the laser diode emission among the laser diodes comprising the array (i.e., the spacing between the emission from laser diodes is independent of diode bar thickness).

Still another object of the present invention is to provide a way to test a laser diode bar as part of a laser diode array, without using solder to permanently attach the bar to the substrate of the array.

The invention is referred to as Bars-And-Springs-In-Slots (BASIS). This laser diode array consists of a substrate which may be monolithic and which has one or more grooves (depending on the size of the laser array). The width of the groove is over-sized to accommodate the placement of a diode bar as well as a spring which secures the diode against one surface of the groove. A metalization layer deposited on the substrate is used to provide electrical continuity to one side of the bar, and the electrically-conductive spring is used to connect the back-side of the bar to the next metalization layer. Unlike the aforementioned "bars-in-grooves" technique, the springs allow electrical continuity to be made without the need for soldering. This allows an important flexibility in that the bars can be tested, and any inferior bars can be replaced prior to completing the assembly of the laser diode array improving yield. Since the active layer of the diode bar rests firmly against one surface of the groove, accurate alignment of the laser diode is ensured which also enables passive microlense alignment using monolithic assemblies.

BRIEF DESCRIPTION OF THE DRAWINGS

FIGS. 4A–G illustrate the fabrication sequence for a fourth embodiment of the BASIS array.

FIGS. 5A–B illustrate the fabrication sequence for a fifth embodiment of the BASIS array.

DETAILED DESCRIPTION OF THE INVENTION

Figure 1A:
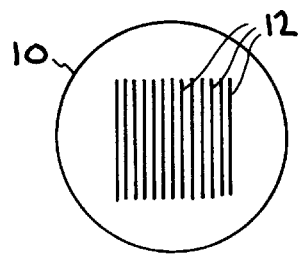
FIGS. 1A–E illustrate the fabrication sequence for an embodiment (#1) of the BASIS laser diode array.

The laser diode array fabrication process is illustrated in FIGS. 1A–E. FIG. 1A depicts a top view of substrate 10 with grooves 12 indicated with dark lines. The array may be formed from a monolithic or composite substrate. The substrate materials should have high thermal conductance (such as BeO, Si, Cu, Cu/W). If an electrically insulative substrate is used, the array may be formed from a single substrate. However, a single substrate cannot be used to form an array if it is electrically conductive. In this case, the heatsink must be composed from a conductive top substrate bonded to an insulative bottom substrate. However, the final features that are created, and their key functionality, will be equivalent in either type of heatsink array.

Figure 1B:
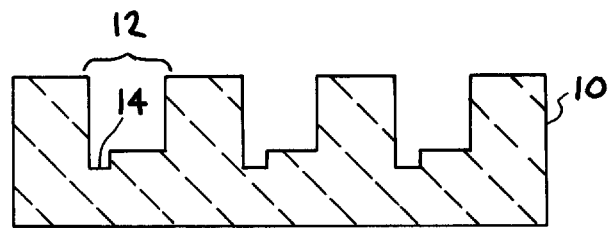

The thickness of the substrate must be longer than the laser cavity length (e.g., ~500 to 1000 $\mu$m). Grooves are formed into the substrate, and the depth of the groove is approximately equal to the laser bar cavity length. A magnified view of a portion of FIG. 1A is shown in FIG. 1B. A smaller groove (called a "notch" here after) 14 which is thinner than the bar (nominally ~100 $\mu$m thick) is located adjacent to the large groove and extends past the large groove. The notch 14 provides a break in the metal so that the laser bar is not electrically shorted. The notch 14 also prevents solder from electrically shorting the backside facet. The pitch (i.e., spacing between the "notched" grooves) can be varied and many arrays could be fabricated from the same initial substrate, for ease of handling. The fabrication technique is material dependent.

In general for a first embodiment, for ceramic materials, such as BeO, sawing (slicing) will be the preferred fabrication technique. To create the "notched" groove feature, a custom-shaped saw blade can be used which has the same profile as the feature. Alternatively, the feature can be made by sawing with a narrow saw blade (less than the diode bar thickness), as well as a larger saw blade (which creates a groove to contain both the laser diode and spring).

In a second embodiment, for Si substrates, sawing (as described above) or wet etching can be used. A KOH-based solution is preferred for anisotropic etching of Si. Because of the high-selectivity in etch rates between different crystal planes, it is easy to produce vertical walls by exploiting the slow etch rate of the {111} crystal planes. This is accomplished by etching a (110) Si wafer with the stripes aligned to the (–1 11) and (1-11) planes. Using standard photolithographic processes a mask is made with a series of stripes. The stripe width corresponds to the opening of the groove and the pitch of the stripes will correspond to the pitch of the laser bar array. Accurate alignment of the stripes to the crystal axis ensures that the etched side walls will be smooth. Accordingly, a "splay" pattern is first wet etched into the substrate to determine the exact orientation of the substrate (since the flats of the substrates are not usually better than a degree). The "splay" pattern is a series of lines (typically <50 $\mu$m wide) fanned-out at varying angles (in fraction-of-a-degree increments) that reside on opposite edges of the top side of the wafer. Once the splay patterns are wet etched some distance (usually >100 $\mu$m deep grooves is sufficient), the wafer is viewed under an optical microscope. Undercutting of the etch mask reveals the two stripes (from corresponding splay patterns) that are perfectly aligned to the proper crystal axis. The next photolithography step which will define the main slots, can be easily referenced to the splay pattern for virtually perfect alignment. For convenience, it is desirable to locate the edge of the major flat (that is used for course alignment) along the [001] direction, i.e., the (–110) plane. Regardless of which side the wafer is etched from, the stripes will always be angled by 35.3° with respect to the major flat.

In this particular embodiment, the substrate is formed from two substrates. The top substrate is etched through in a series of slots and the wafer thickness equals that of the eventual laser bar that will be located therein. Hence, the etch time and etch depth uniformity do not have to be precisely controlled. Also, since this wafer is etched completely through, etching time can be reduced by etching from both sides simultaneously. In which case, the identical etch mask can be patterned on the backside of the wafer. The bottom substrate is used to define the notch. Patterning is similar to the top substrate, except that the stripes are approximately 100 $\mu$m in width. The depth of the notch is approximately 100 $\mu$m deep. A reference flat on both the top and bottom wafers is produced by sawing; the reference flat will be needed later for alignment during wafer bonding. After sawing, the etch mask (typically SiN) is removed (e.g., by HF solution) and rinsed to remove any contamination on the etched substrates. The top and bottom substrate are pressed together against a straight edge to maintain alignment (other approaches could be used). The wafers are annealed at high temperatures in a furnace (typically ~1000° C. for ~24 hours), so that the wafers are fused into a single structure that resembles the figure. In practice, it is easiest to straddle the notch underneath the left-side wall, so that alignment of the top and bottom substrates is not critical. Pressure/vacuum bonding has been shown to increase the area of surface contact to produce more reliable bonding.

Figure 1C:
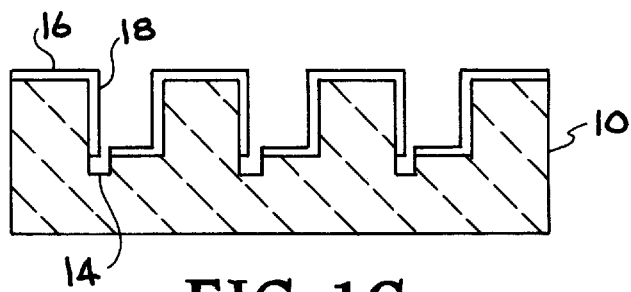
Figure 1D:
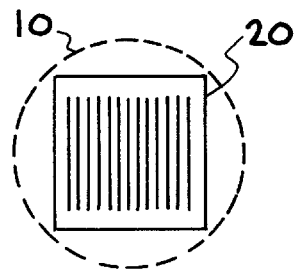

Referring to FIG. 1C, a metalization layer 16 is placed on substrate 10 to provide electrical continuity between adjacent laser bars that will be placed therein. The frontside metalization can be accomplished using two angled evaporations (or sputter depositions) in opposite directions, so that there is metal deposited everywhere except for along the base 14 of the notch (due to shadowing). A thin layer of metal, such as Ti or Cr (~50 nm) is usually evaporated first to provide good adhesion to the substrate, followed by a thick layer (~10 $\mu$m) of highly electrically conductive material (such as Ag or Cu). As shown in FIG. 1D, the substrate will then be sawed into smaller units 20, called submounts, or alternatively, can be metalized prior to sawing individual units. In the latter case, the sides of the individual submounts must be protected from stray metalization that could electrically short the laser bars that will eventually be loaded therein.

Figure 1E:
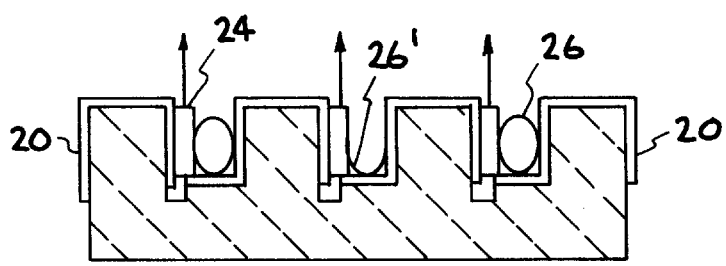

Referring to FIG. 1E, electrical contacts 20 are bonded to the substrate 10. Also, an additional heatsink 22 can be bonded to the back of the substrate. The size and kind of heatsink will depend on the average power dictated by the particular application.

Figure 1F:
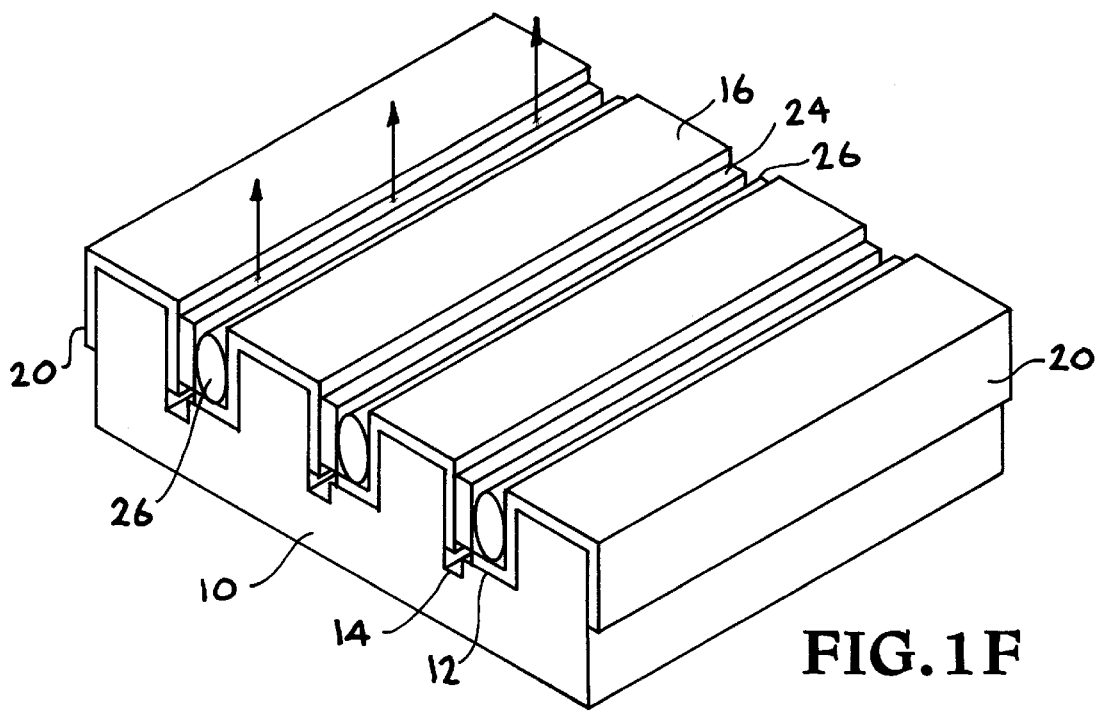
FIG. 1F shows a three dimensional perspective view of the embodiment of FIGS. 1A–E.

The laser bars 24 are now placed in the grooves with the top-side (usually p-side), nearest the active layer, contacting the side containing the notch, along with a spring 26, which contacts the bottom-side (usually n-side) of the laser bar and the opposite side of the groove. The spring 26 can be fabricated from any electrically conductive material that is flexible and provides restoring force (such as Ni, Cu, or Be, or combinations of those materials) in order to keep the laser diode secured on one face of the groove. As shown in FIG. 1E, a tube or u-shaped spring 26' are probably the preferred embodiments (but the particular geometry is unimportant, only that it provides electrical continuity and provides a restoring force). Many bars can be electrically connected in parallel by adjoining the edges of the laser bars depending on the desired emission geometry. FIG. 1F shows a three dimensional perspective view of the embodiment of FIGS. 1A–E.

The laser diode array can now be tested, and any inferior and/or damaged laser bars can be identified and replaced. This key flexibility is desirable to ensure that ~100% of completed laser diode arrays can be fabricated which will drastically reduce manufacturing costs.

In applications that require severe environments, it may be desirable to deposit a solder-layer prior to loading the diode bars (such as, ~3 $\mu$m thick layer of In deposited by angled-evaporation or angled-sputtering) to ensure reliable electrical and thermal contact to the surface of the wall. The springs can also be coated with solder as described above. The solder layer can then be re-flowed at the solder melting point (a reducing environment is often used to ensure contiguous bonding across the diode bar surface). The spring maintains diode bar alignment while the solder layer is reflowed.

Figure 2:
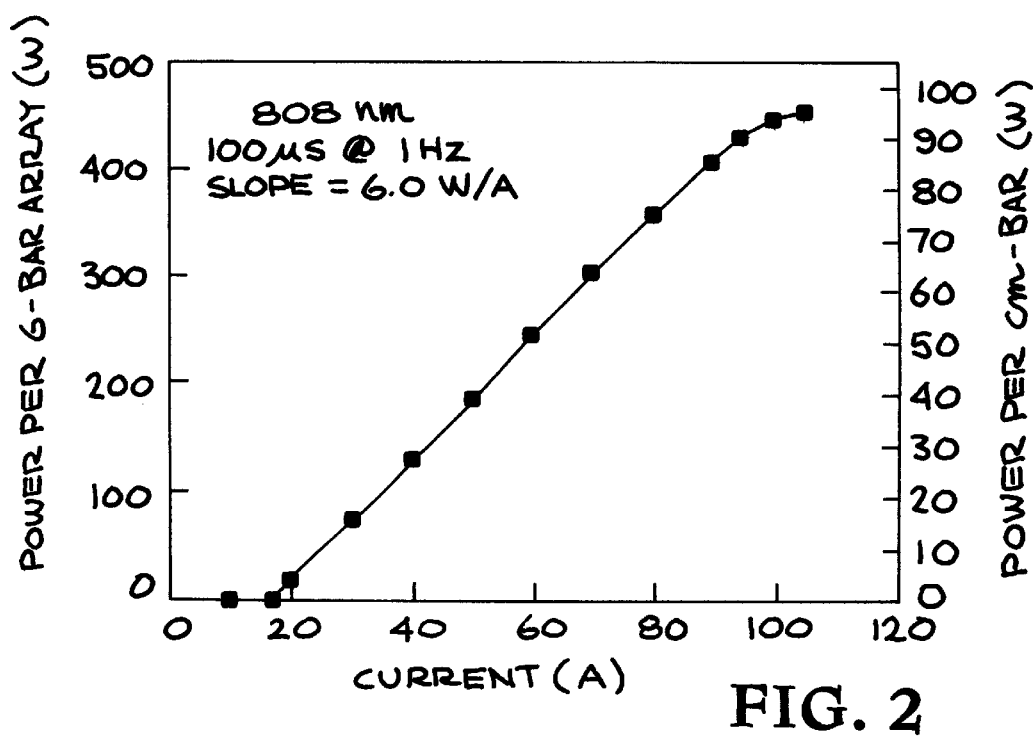
FIG. 2 shows a plot of power versus current for a 6-bar BASIS array.

A six-bar BASIS array has been fabricated from Si substrates that were etched and bonded together using this embodiment. The substrates were each 500 $\mu$m thick, and the bar spacing was 1 mm. A thin solder layer (In) was incorporated as described above on both the substrate and springs. Tube-springs, formed by electro-formed Ni (a commercially-available process), were used. The diameter and wall thickness of the springs was ~500 $\mu$m and ∞10 $\mu$m, respectively. To facilitate loading the spring, a mandril was used to deform the spring so that it fit into the groove more easily (the mandril ran through the center of the tube-spring). Once the spring was in place, the mandril was pulled out from the spring. Laser output data versus drive current is shown in FIG. 2. At 808 nm, 100 microseconds and 1 Hz, this array produced roughly 100 watts per cm of laser bar at about 125 amperes. This corresponds to a emitting aperture of ~1 kW/cm$^2$ (peak power).

The laser bars were DQW-GRINSCH (double quantum well, graded-index separate confinement heterostructure) grown from AlInGaAs/GaAs with a peak operating wavelength of ~808 nm. Note that only conventional laser diode fabrication processes (commonly found in the open literature) were used to fabricate the laser bars. A two-dimensional scan of the output showed uniform emission indicating a contiguous metal bond across each diode bar in the array. The high slope efficiency also indicates that the packaging approach produced uniform and reliable electrical contacts.

Figure 3A:
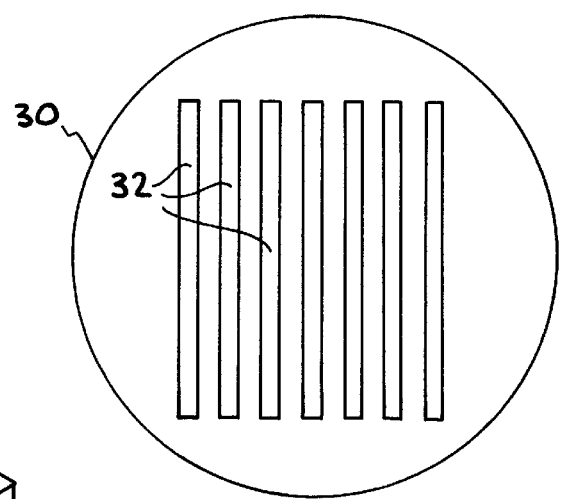
FIGS. 3A–C illustrate the fabrication sequence for a third embodiment of the BASIS array.
Figure 3B:
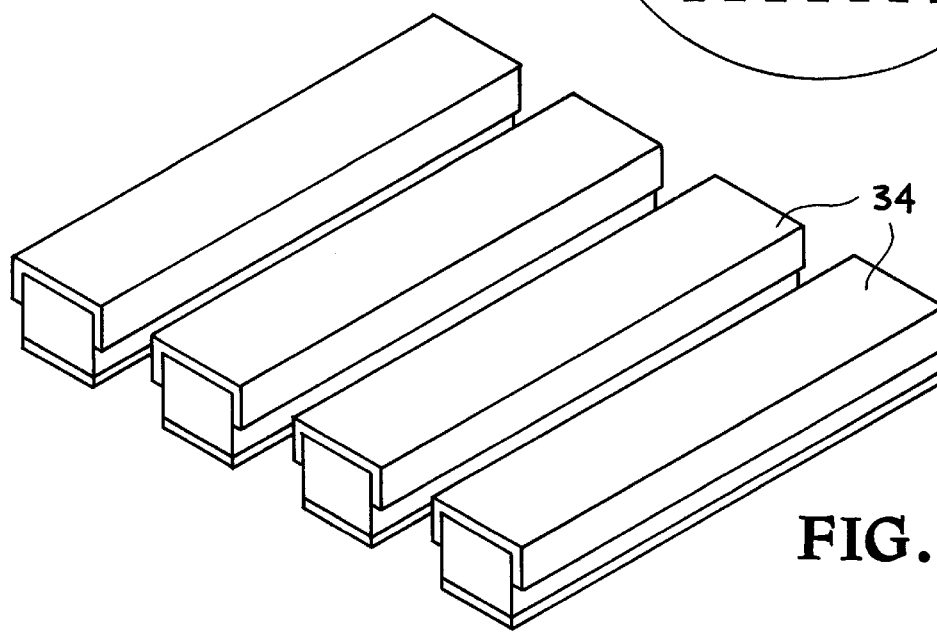
Figure 3C:
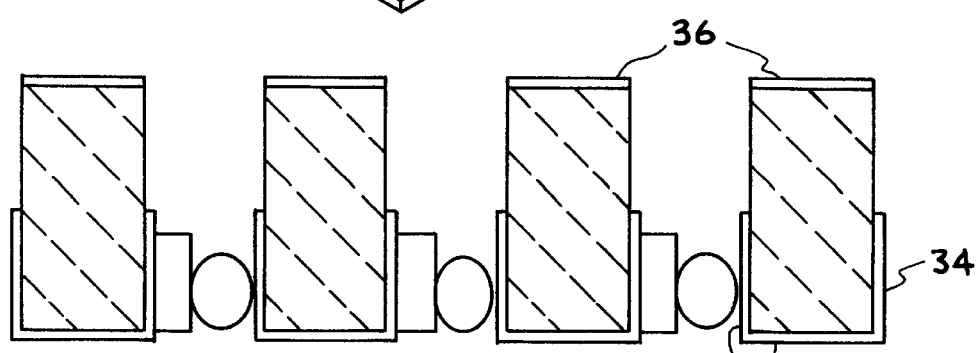

In a third embodiment shown in FIGS. 3A–C, the substrate has through slots, so that the diode bars can be loaded from the backside of the substrate. In this way, regardless of cavity length of the laser diodes, the output facets will remain well aligned to the surface of the substrate heatsink.

FIG. 3A shows substrate 30 and slots 32. Through-slots are fabricated and the length of the slots is longer than the diode bar cavity. FIG. 3B shows a magnified view of FIG. 3A, after the substrate 30 has been sawed into that resembling a ladder (in which each diode bar and spring will be sandwiched between the rungs of the ladder). A metal coating 34 is placed on the individual assemblies. This angled-metalization step is performed similar to the previous embodiment except that shadowing is used to allow a metalization break along the wall. Therefore, a notch is not required in this embodiment. The "rails" of the ladder must also be protected (e.g., using a shadow mask) to prevent metal deposition which would electrically short the laser bars. As illustrated in FIG. 3C, a metal coating 36 is placed on the backside of the substrate which will be used to bond a backplane heatsink. The bars and springs are now loaded from the "backside" of the substrate against a fixture with a flat surface (to register the bar and spring flush with the edge of the substrate). In the embodiment described in FIGS. 3A–C, the contacts, testing, and bar soldering process is the same as used in the embodiment described in FIGS. 1A–E. However, in this case the back-plane heatsink (if used) must be bonded after the laser diode bars have been loaded.

Figure 4A:
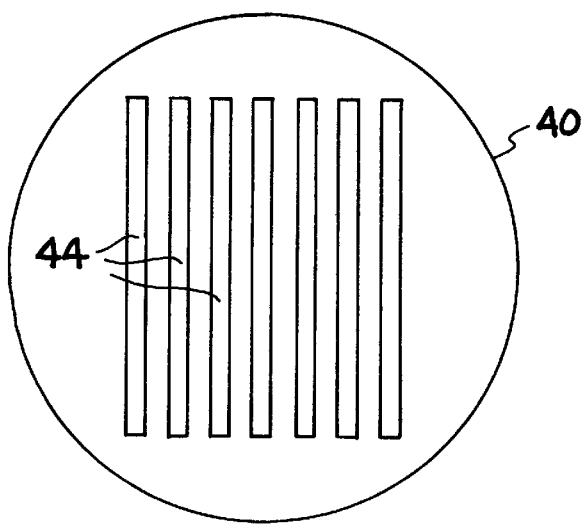
Figure 4B:
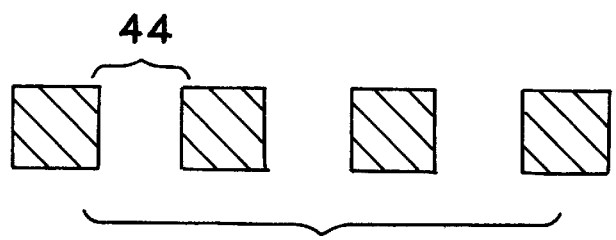
Figure 4C:
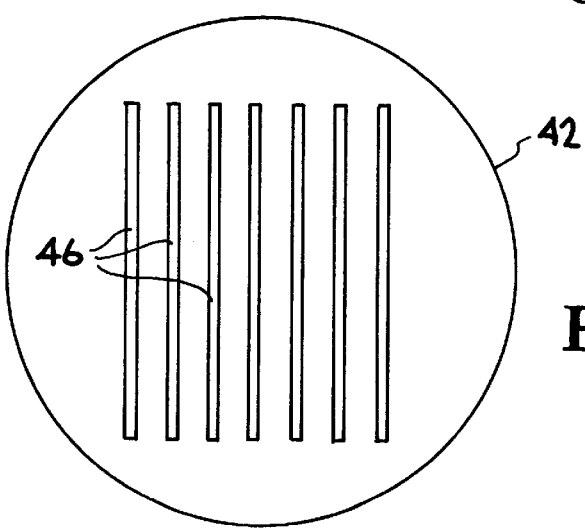
Figure 4D:
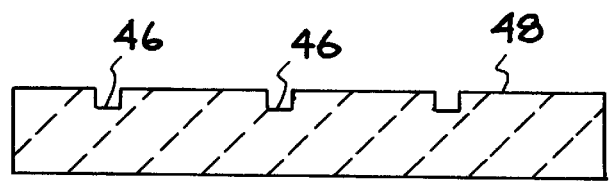

A fourth embodiment of the laser diode array fabrication process of the present invention is illustrated in FIGS. 4A–E. The array is formed from two substrates. The top substrate 40 (FIG. 4A) should have a high thermal conductance and is electrically conductive (such as Cu or composite metal (e.g., Cu/W which is thermally expansion matched to the diode bar and/or the bottom substrate). The bottom substrate 42 (FIG. 4C) should have high thermal conductance and is electrically insulating. The thickness of the top substrate must be approximately equal to the laser cavity length (e.g., ~500 to 1000 $\mu$m). As shown in the magnified view of FIG. 4A, FIG. 4B illustrates that slots 44 are formed into the conductive (top) substrate 40. The fabrication technique is often material dependent. However, EDM is probably the preferred method for achieving sufficiently smooth surfaces and sharp corners in soft conductive materials (e.g., Cu). The bottom insulative substrate 42 is sawed or etched with the same pitch. However, the notch 46 width shown in FIG. 4D is thinner than the bar and will be located adjacent to the large slot. The notch 46 provides a break in the metallization layer 48 so that the laser bar is not electrically shorted. The notch 46 also prevents solder from electrically shorting the backside facet.

The bottom substrate 42 is bonded to the top substrate 40 as shown in FIG. 3E, such that the two sets of slots (44 and 46) are properly aligned. A thermally conductive material is desirable for the bonding material, so solder can be employed. Solder can be evaporated (e.g., In) before or after the notches are fabricated into the bottom substrate. The two substrates are now aligned in a fixture (using a reference edge) and bonded together (typically with a solder layer). Analogous to the embodiment in which two Si substrates are joined to form a heatsink, it is convenient to straddle the notch midway between the side wall so that the alignment tolerances are loosened. Afterwards a single substrate is produced that can be processed similarly to the embodiment described in FIGS. 1A–E. FIG. 4F shows the step separating the individual assemblies 48. The contacts, testing, soldering steps, and heatsink are performed on the final assembly similarly to that of the embodiment described in FIGS. 1A–E. FIG. 4G shows the final assembly with top substrate 40 bonded to bottom substrate 42 and the spring 50 held laser diode 52.

In a fifth embodiment, the electrically-conductive top layer and insulative bottom layer can be bonded together first. Wire EDM 60 can be used to machine both the groove and the notch simultaneously in the top substrate 54, so that the bottom substrate 56 does not have to be machined at all (FIG. 5A). In this embodiment, each submount is fabricated individually. As shown in FIG. 5B, the wire is translated from one end of the conductive substrate (61), forms one corner of the groove (62), changes direction and continues until it reaches the underlying insulative substrate (63), returns along the same path and then changes direction (64) to form the bottom of the groove, changes direction again to form the other inner-side of the groove (65), and returns to the top of the substrate (66) and changes direction, which repeats the process until the other side of the substrate is reached (depending on the size of the array). The contacts, testing, soldering steps, and heatsink are equivalent to that of the embodiment described in FIGS. 1A–E.

Changes and modifications in the specifically described embodiments can be carried out without departing from the scope of the invention, which is intended to be limited by the scope of the appended claims.

The invention claimed is:

1. A laser diode array comprising:

a substrate having upper and lower major surfaces and at least one groove formed in said upper major surface along a length of said substrate, said at least one groove having side walls formed in said substrate;

a metallization layer disposed along said upper major surface and said side walls of said at least one groove to form at least one metallized groove;

a laser diode bar disposed in said at least one metallized groove; and at least one electrically-conductive spring, wherein said spring secures said laser diode bar against one surface of said at least one metallized groove to allow electrical continuity to be made without the need for soldering, to precisely index said laser diode bar and to provide accurate, repeatable alignment of laser diode emission from each laser diode bar of said laser diode array.

2. The laser diode array of claim 1, wherein said metallization layer comprises a gap.

3. A laser diode array comprising:

a substrate having a major surface with at least one groove with side walls;

a laser diode bar disposed in said at least one groove;

means for providing electrical continuity through said laser diode bar; and at least one electrically-conductive spring, wherein said spring secures said laser diode bar against one surface of said at least one groove to precisely index said laser diode bar and to provide accurate, repeatable alignment of laser diode emission from each laser diode bar of said laser diode array.

4. The laser diode array of claim 3, wherein said means for providing electrical continuity through said laser diode bar comprise a metallization layer disposed along said major surface and said side walls of said at least one groove to form at least one metallized groove.

5. The laser diode array of claim 3, wherein said means for providing electrical continuity through said laser diode bar comprise a metallization layer disposed along said major surface and said side walls of said at least one groove to form at least one metallized groove, wherein said metallization layer comprises at least one notch having no metallization therein.

6. The laser diode array of claim 3, wherein said substrate is monolithic.

7. The laser diode array of claim 5, wherein said substrate is monolithic.

8. The laser diode array of claim 3, wherein said substrate comprises a first substrate bonded to a second substrate, wherein said first substrate is electrically conductive and said second substrate is insulative, wherein said at least one groove is formed in said first substrate.

9. The laser diode array of claim 8, wherein said second substrate comprises at least one notch.

10. The laser diode array of claim 9, wherein said means for providing electrical continuity through said laser diode bar comprise a metallization layer disposed along said major surface and said side walls of said at least one groove to form at least one metallized groove, wherein said at least one notch has no metallization therein.

11. The laser diode array of claim 3, further comprising electrical contacts bonded to said substrate.

12. The laser diode array of claims 3, wherein said at least one groove comprises at least one through-slot.

13. The laser diode array of claim 3, wherein said substrate comprises a top substrate and a bottom substrate, wherein said top substrate has a high thermal conductance, is electrically conductive and has a thickness that is about the same as the laser cavity length of said at least one laser diode bar and wherein said bottom substrate has a high thermal conductivity and is electrically insulative.

14. The laser diode array of claim 3, wherein said substrate has a thickness that is slightly larger than the laser cavity length of said at least one laser diode bar.

15. The laser diode array of claim 3, further comprising a backplane heatsink bonded onto said laser diode array.

* * * * *